United States Patent
Macours

(10) Patent No.: US 7,539,614 B2
(45) Date of Patent: May 26, 2009

(54) SYSTEM AND METHOD FOR AUDIO SIGNAL PROCESSING USING DIFFERENT GAIN FACTORS FOR VOICED AND UNVOICED PHONEMES

(75) Inventor: Christophe Marc Macours, Leuven (NL)

(73) Assignee: NXP B.V., Eindhoven (NL)

( * ) Notice: Subject to any disclaimer, the term of this patent is extended or adjusted under 35 U.S.C. 154(b) by 790 days.

(21) Appl. No.: 10/736,939

(22) Filed: May 17, 2004

(65) Prior Publication Data

US 2005/0108008 A1    May 19, 2005

(30) Foreign Application Priority Data

Nov. 14, 2003  (EP)  ................................. 03104210

(51) Int. Cl.
G01L 19/14 (2006.01)
G01L 21/02 (2006.01)

(52) U.S. Cl. ...................... 704/225; 704/224; 704/226

(58) Field of Classification Search .................. 704/225
See application file for complete search history.

(56) References Cited

U.S. PATENT DOCUMENTS 4,630,305 A * 12/1986 Borth et al. ................ 381/94.3
4,887,299 A * 12/1989 Cummins et al. ........... 381/317
5,553,134 A *  9/1996 Allen et al. ............. 379/390.03
5,794,187 A *  8/1998 Franklin et al. ............. 704/225
5,890,125 A *  3/1999 Davis et al. ................. 704/501
6,157,670 A * 12/2000 Kosanovic .................. 375/227
6,363,338 B1 *  3/2002 Ubale et al. ............... 704/200.1
2002/0015503 A1  2/2002 Hou
2002/0057808 A1 *  5/2002 Goldstein ................... 381/106
2002/0173950 A1 * 11/2002 Vierthaler ................... 704/208

OTHER PUBLICATIONS

Life Vibes, Voice Clarity, Speech enhancer, Date of Release: Feb. 18, 2003, 3GSM Conference, 2 pages. Philips, Published in the Netherlands.

* cited by examiner

Primary Examiner—David R Hudspeth
Assistant Examiner—Brian L Albertalli

(57) ABSTRACT

In a sound reproduction or recording system an audio signal is multiplied by a gain factor (z) which is dependent on the input level (y). The dependence of the gain factor on input level is chosen such that unvoiced phonemes are at least 6 dB, preferably at least 12 dB more enhanced than voiced phonemes, where preferably the average gain is less than 6 dB. This improves the intelligibility.

28 Claims, 10 Drawing Sheets

SYSTEM AND METHOD FOR AUDIO SIGNAL PROCESSING USING DIFFERENT GAIN FACTORS FOR VOICED AND UNVOICED PHONEMES

This invention relates to the field of sound reproduction, and more particularly to the field of digital audio signal processing.

The invention relates to a sound reproduction or recording system comprising an audio signal input, an audio signal processor and an audio signal output.

The invention also relates to an audio signal processor for processing an incoming audio signal in an audio output signal. In particular the invention relates to a digital signal processor (DSP) circuit or program.

The invention also relates to a method for processing an audio signal.

A sound reproduction system, such as e.g. a loudspeaker telephone system, includes an output transducer, often called a loudspeaker, and an input for an audio signal. The loudspeaker produces sound pressure waves in response to the audio input signal which is representative of a desired sound pressure wave.

Intelligibility of the sound as perceived by the listener is very important, especially in noisy environments. The simplest way to increase the intelligibility is to increase the average SPL (Sound pressure level), i.e. turning up the volume. However, simply turning up the volume does not always lead to a more intelligible sound. Also, too high an output may lead to an overloading of a loudspeaker resulting in a further decrease of the intelligibility. The noise on the signal may e.g. be environmental noise, or signal noise, i.e. noise that is added to a signal on the way between the source and the receiver.

A number of attempts have been made to increase the intelligibility of sound.

U.S. Patent application U.S. 2002/0015503 proposes e.g. to increase intelligibility by individually constraining the gain factors for different frequency bands.

The existing systems and methods are, however, either very complicated, requiring complicated computations and thereby complicated circuitry (hard-ware), or, in the case of a program (soft-ware) being used, a complex program, or supply only a limited advantage.

Notwithstanding the above-mentioned references, there continues to exist a need in the art for improved systems and methods providing improved intelligibility.

It is an object of the present invention to provide a relatively simple sound reproduction or recording system and method with improved intelligibility.

To this end, in a first aspect of the invention, the sound reproduction or recording system in accordance with the invention is characterized in that the digital audio signal processor comprises an attributor for attributing a gain factor to input signals as a function of input level with a functional relationship such that the functional relationship between gain factor and input level comprises a first and second range, the first range covering amplitudes in which mainly voiced phonemes are situated, the second range situated at input levels lower than those for the first range and covering input levels in which mainly unvoiced phonemes are situated, wherein the functional relationship is such that the average gain factor for the first range lies at least 6 dB, preferably at least 12 dB, below that for the second range.

The system in accordance with the first aspect of the invention is based on the following insights:

It is possible to use a simple system for improving intelligibility of the speech. The smallest units of speech sounds are called phonemes. One or more phonemes combine to form a syllable, and one or more syllables to form a word. Phonemes can be divided into two groups: vowels and consonants. Vowels are always voiced. For unvoiced consonants, the folds may be completely open (such as when producing "s", "sh", and "f" sounds) or partially open (for "h" sounds). Voiced sounds are created by vibrations of the vocal folds.

The system in accordance with the invention is based on the recognition that speech may be considered to be comprised of voiced phonemes (such as vowels a, e, i, o, oa etc) and unvoiced phonemes (such as some consonants s, z, ch, dg, th etc.). More details will be given below. The unvoiced phonemes typically cover an input level range (the second range) below the input level range) typical for voiced phonemes (the first range), The voiced phonemes are typically situated in a upper range of the signal, i.e. near a maximum of the signal. When only the loudness (amplitude) of the produced speech is considered, the voiced phonemes are much more prominent than the unvoiced phonemes. In terms of intelligibility, however, the unvoiced phonemes are as important, if not more important than the voiced phonemes.

The two types of phonemes may thus be distinguished from each other by their input level ranges. In the system in accordance with the first aspect of the invention the gain factor for unvoiced phonemes (the second range) is larger (on average at least 6 dB, preferably 12 dB or more) than for the voiced phonemes. Hereby the unvoiced phonemes are emphasized over the voiced phonemes. Most known system are based on the premise that by increasing the gain (turning up the volume) the speech becomes easier to understand. However this is not always the case. The inventor has realized that such increase in overall intensity (loudness increase) may in fact "drown" the unvoiced phonemes. Compared to simply increasing the gain factor throughout the input level range the unvoiced phonemes are emphasized over the voiced phonemes which offers an improvement in intelligibility in a simple manner.

In a second aspect of the invention the sound reproduction or recording system in accordance with the invention is characterized in that the digital audio signal processor comprises an attributor for attributing a gain factor to input signals as a function of input level, wherein the functional relationship between gain factor and the input level is such that a first and second range are present, the first range extending from a maximum value input level downwards at least 10 dB, the second range extending at input levels below the first range, said second range covering a range of 10 db or more, wherein the gain factor in the first range is at least on average 6 dB, preferably 12 dB, lower than in the second range.

Generalizing the basic insight of the first aspect of the invention, the invention in accordance with the second aspect of the invention is based on the recognition that in speech "soft sounds" are of equal or similar importance for speech intelligibility as "hard sounds", however such sounds are called. The intelligibility of speech is in the invention by simple means increased by preferentially (at least 6 dB, preferably at least 12 dB) boosting the "soft sounds" over harder sounds, or in other words preferentially boosting a second, lower amplitude, range of signals over the first, higher or highest amplitude, range of signals. This basic, generalized, insight holds irrespective of whether the particular language used may be or is theoretically divisible in "voiced" and "unvoiced" phonemes, if and where the dividing line between these categories is theoretically drawn, or whether there are other types of distinguishing characteristics such as musical accents, tone shifts, emphasizing etc that may come into play.

In the system in accordance with the second aspect of the invention the gain factor is made dependent on the input level, wherein there is a first range below a maximum input level (covering the hardest sounds), extending at least 10 dB downwards from a maximum level and a second range below the first range (covering "softer sounds") in which the gain factor is considerably higher (on average at least 6 dB, preferably at least 12 dB). The gain curve as a function of input levels thus shows two ranges, and the effect is that the sound signal covered by the second range (the softer sounds) are highlighted in respect of the sound signals in the first range, thus emphasizing the "softer sounds" in respect of the "hard sounds". This is possible using a simple system and method and yet is found to increase intelligibility considerably.

Preferably the first range extends from the maximum at least 15 dB, but not more 30 dB. Too large an extent of the first range would make it difficult to boots the soft sounds.

Preferred embodiment of the invention are herein below given. Unless otherwise described these preferred embodiments hold for both of the above given aspects of the invention.

Preferably the attributor for attributing a gain factor to input signals as a function of input amplitude is arranged such that the average gain factor over the first and second range is less than 12 dB, preferably less than 6 dB, even more preferably less than 3 dB. The average gain factor is a measure for the overall boost in loudness. An increase in the loudness of the speech is then not or hardly perceivable. The positive effect of highlighting the unvoiced phonemes in respect of the voiced phonemes is at least partly nullified if the average gain factor is increased substantially. It is remarked that this condition means that the average boost in the first range is limited to below the indicated value.

In a preferred embodiment the system comprises a dynamic level detector having an input for the instantaneous signal amplitude and an output for providing an average level over a predetermined time period.

The dynamic level detector thus provides a level, i.e. some sort of time average for the signal amplitude. Compared to using the instantaneous amplitude for the input level (i.e. directly using the amplitude to find the gain) the advantage of using a dynamic level detector is a smoother behavior of the gain factor and less change of pumping effects. In all the intelligibility increases. The time period may be fixed or adjustable.

Preferably the predetermined time period is preferably 1 to 5 milliseconds.

Preferably the attributor for attributing a gain factor is arranged such that the gain factor in the first range is on average below 10 dB, preferably below 6 dB. The gain in the first, high input level, range is thus relatively low, i.e. a low boost of the "hard" signal, respectively the voiced phonemes occurs. The signals in the second range are, as explained above, preferentially boosted in respect of the signals in the first range, by at least 6 dB, preferably more. It is preferred to keep the gain factor for the first range low, since too much of an increase in strength (high gain factor) for the signals in this first range, which signals are already loud, would not increase the intelligibility of speech much, but may cause the relatively weak signals in the second range, despite the relatively boost, to become difficult to distinguish from the hard sounds.

Preferably the system comprises a determinator for determining a maximum input level of a received signal and a means for equating the maximum input level with the upper edge of the first range. In embodiments the maximum input level (=outer edge of the first range) may be simply the maximum digital signal, i.e. the theoretically and practically loudest signal. Preferably, however, the device comprises a determinator for determining the actual maximum input level of the (speech) signal, which often lies below the maximum possible. The first range then starts from the measured maximum input level of the speech signal. It is to be noted that in such embodiments not just the starting point of the first range is dependent on the measurement, but that this carries through in the second range and possible further ranges. The maximum input level is a quantity that is measured over a predetermined time period relatively long in comparison to the time periods for measuring the level, but short in comparison to the lengths of words.

Within preferred embodiments of the invention the attributor for attributing a gain factor to input signals as a function of input amplitude is arranged such that the functional relationship between gain factor and the input level is such that between the first and second range a third, intermediate range is present in which the gain factor changes gradually. Within embodiments of the invention, the transition from first to second range may be a step function but, preferably, the first and second ranges are separated by an intermediate third range, within this third range the gain factor gradually changes. Such a transition range decreases the risk of pumping artefacts. Preferably this third range extends over at least 5 dB in input level. Preferably this third range is centered between 15 dB and 35 dB below the maximum (=the outer edge of the first range I). Centered means that the point for which the gain factor is halfway in between the values of the gain factor at either side of the third range. This leaves enough room for the first range.

Preferably the system comprises a sensor for measuring background noise, and an adjustor for adjusting the gain factor in the second range in dependency on the measured background noise. Background noise is noise due to interfering sound signals from the environment.

When there is a lot of background noise, increasing the gain factor in the second range, i.e. primarily for the soft sounds or the unvoiced phonemes will increase the intelligibility of such signals.

Preferably the gain factor in the first range (i.e. primarily for the hard sounding voiced phonemes) is for such embodiments unaltered, or even slightly reduced. The hard sounds or the voiced phonemes will be audible even at high background noise, a slight reduction of the gain factor for the first range may in fact be advantageous because it will increase the relative boost of the soft sound or unvoiced phonemes in respect of the hard sounds or voiced phonemes. It may seem strange to decrease the gain factor in the first range when a high noise level is measured, but by increasing the gain factor in the second range and simultaneously decreasing in the first range the increase in the overall signal strength may be kept steady or at least not increased too much. It is remarked that, in circumstances, this may lead to a slightly negative gain factor (of a few to several dB) for at least a part, for instance the highest part, of the first range.

These embodiments are amongst others based on the recognition that the invention does improve intelligibility of speech, but that it also deforms the speech signal to some extent. By measuring the background noise and making the gain factor in the second range dependent on the noise level on average a better sound reproduction is achieved. When the background noise level is low, little or no change is made in the signal, when the background noise level is high the gain factor in the second range is increased.

Preferably the attributor for attributing a gain factor to input signals as a function of input amplitude is arranged such that the second range is, at a lower boundary value, juxtaposed by a fourth range in which the gain factor is substantially zero. Such a fourth range covers small amplitude levels, where the signal is probably mainly due to line or transmission noise. In the preferred embodiment a much smaller gain factor (or preferably none at all) is applied below in said fourth range. Line or transmission noise is then not amplified. Preferably the attributor for attributing a gain factor to input signals as a function of input level is arranged such that the second and fourth range are separated by a fifth, intermediate range within which the gain factor gradually changes. In embodiments the transition between the fourth and second range may be a step function but a gradual change from a zero gain factor in the fourth range to a high gain factor in the second range, as in preferred embodiments, reduces the risk of artifacts, and may increase the signal-noise.

Preferably the attributor for attributing a gain factor to input signals as a function of input level is arranged such that that the slope of the decrease in gain factor in the third range is softer than the rise in gain factor in the fifth range.

Preferably, the system comprises a measurer for measuring line or transmission noise (i.e. noise intrinsic to the way the signal has been transmitted, e.g. electronic component noise, compression noise, . . . ) or an input for a value for line or transmission noise and an adjustor for adjusting the transition point or range from the second to the fourth range in dependence on the measured line noise.

The invention may be applied at the source end of a sound reproduction system (e.g. a voice communication system). The invention may also be applied at the receiver end of a sound reproduction system, e.g. in a mobile telephone, or a laptop p.c., etc. The latter is especially of use when environmental noise is high.

When the invention is used at the source end of a sound reproduction system (e.g. production of a t.v. signal) preferably the sound reproduction system comprises a marker for providing the transmitted or to be transmitted signal with a mark indicating that the signal has been altered from the original signal. Preferably the mark comprises information on the alteration, e.g. information on gain factors and ranges. As stated above, the device and method in accordance with the invention improves intelligibility, a relatively small price has to be paid, however, some distortion of the signal does take place. However, if the invention is performed twice, i.e. at the source end at the receiving end, the risk of overkill is present, i.e. there is a risk that the end result is far from optimal. By providing a mark indicating that the signal has been processed (and preferably also how) this risk may be reduced.

Within the concept of the invention a 'sensor', "detector", "marker", "attributor", "adjustor", "measurer" etc are to be broadly understood and to comprise e.g. any piece of hardware (such a sensor, detector, attributor, detector), any circuit or sub-circuit designed for performing such action or function as described as well as any piece of software (computer program or sub program or set of computer programs, or program code(s)) designed or programmed to perform such action or operation in accordance with the invention as well as any combination of pieces of hardware and software acting as such, alone or in combination, without being restricted to the below given exemplary embodiments. They may come in the form of for instance a DSP or a ASIC or a microphone, or an algorithm, separate or as part of a larger program. One program may combine several functions. Preferably the system is based at least partly on digital signal processing using digital signals.

The invention is also embodied in a method for audio signal enhancement in or for a sound reproduction or recording system wherein input signals are multiplied with a gain factor, said gain factor being a function of input level, wherein the functional relationship between gain factor and an input level is such that a first and second range for the gain factor are present, the first range covering amplitudes in which mainly voiced phonemes are situated, the second range situated at input levels lower than those for the first range and covering input levels in which mainly unvoiced phonemes are situated, wherein the functional relationship is such that the average gain factor for the first range lies at least 6 dB below that for the second range.

The invention is also embodied in a method for audio signal enhancement in or for a sound reproduction or recording system wherein input signals are multiplied with a gain factor, said gain factor being a function of input level, wherein the functional relationship between gain factor and an input level is such that a first and second range for the gain factor are present, the first range extending from a maximum value input level downwards at least 10 dB, the second range extending at input levels below the first range, said second range covering a range of 10 db or more, wherein the average gain factor in the first range is at least on average 6 dB lower than in the second range.

Preferred embodiment of the methods are those corresponding to the method steps associated with the described preferred embodiment of the systems in accordance with the invention, whether in the summary of the invention or the description of preferred embodiments.

The invention is also embodied in any computer program comprising program code means for performing a method in accordance with the invention when said program is run on a computer as well as in any computer program product comprising program code means stored on a computer readable medium for performing a method in accordance with the invention when said program is run on a computer, as well as any program product comprising program code means for use in a system in accordance with the invention, for performing the action specific for the invention.

These and further aspects of the invention will be explained in greater detail by way of example and with reference to the accompanying drawings, in which FIG. 1 is a schematic diagram of a system including a loudspeaker, and a DSP.

FIGS. 2A and 2B schematically illustrate various components of a sound reproduction system.

The present invention will now be described more fully hereinafter with reference to the accompanying drawings, in which preferred embodiments of the present invention are shown. This invention may, however, be embodied in many different forms and should not be construed as limited to the embodiment set forth herein; rather, these embodiments are provided so that this disclosure will be thorough and complete, and will fully convey the scope of the invention to those skilled in the art. Like numbers refer to like elements throughout.

Figure 1:
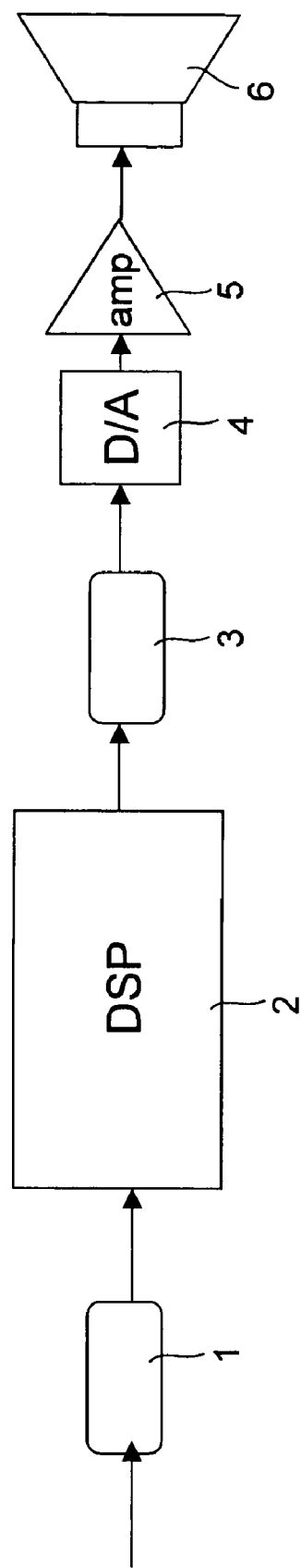

FIG. 1 illustrates schematically a sound reproduction system. Such system can for instance be a hands-free loudspeaker cellular radiotelephone for use in an automobile. When implemented as a hands-free cellular telephone, speech signals received from a far end, i.e. from a distant party, are transmitted from a cellular base station (not shown), received by the transceiver of the cellular phone (not shown), and applied to the input 1 for an incoming far end signal as an input waveform W. In this example it is assumed that the transmission back and forth between the system, in this example a telephone system, and the far end is in a digital form. If the original signals are in an analogue form the system comprises a A-to-D converter to generate a digital far end signal which is then fed into input 1.

As shown in FIG. 1, the waveform is applied in a digital format at input 1 or connected to a DSP (digital sound processor) 2, which is connected or which comprises a digital output 3. The digital signal output is fed to and converted to an analog format by D-to-A converter 4 and amplified by amplifier 5 for use by the loudspeaker 6. A sound pressure wave W1 representative of the speech of the distant party is emitted by loudspeaker 6. Accordingly, the radiotelephone user hears sound pressure waveforms that are representative of the speech of the distant party.

However, the listener does not just hear the sound generated by the loudspeaker, but also other sounds, which may make the sound generated by the loud speaker difficult to understand, i.e. of low intelligibility.

Turning up the volume seems a first and obvious choice to increase the intelligibility. However, the maximum output level of the loud speaker is often limited and simply turning up the volume often leads to more noise, not necessarily a better intelligibility of the signal.

Figure 2A:
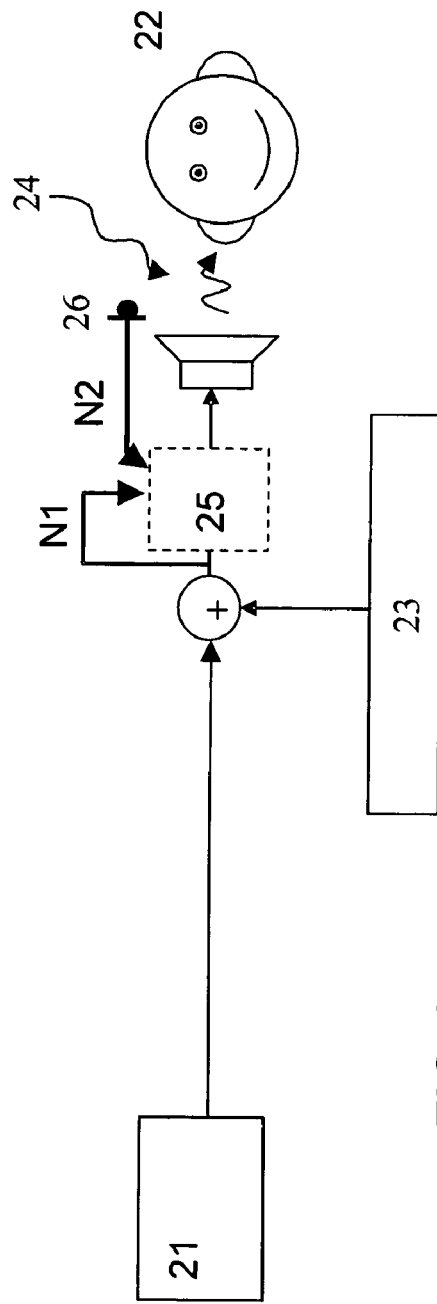

FIG. 2A illustrates that in between the source (clear speech) 21, and the ear 22 of the user, there are two sources of noise, transmission noise 23 and background noise 24.

To improve the intelligibility a number of measures are taken in the device and method in accordance with the invention. In particular a sensor 26 may be provided to measure background noise 24, giving a background noise signal N2, and a measurer 27 for measuring transmission noise 23, giving a line or transmission noise signal N1.

Figure 2B:
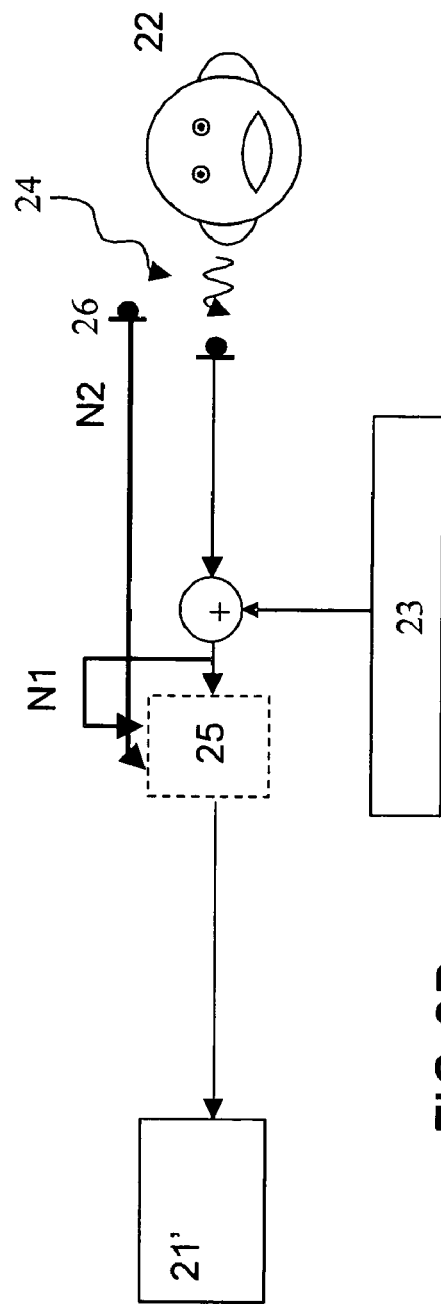

FIG. 2B illustrates the source end of a sound reproduction system. In this FIG. 21 stands for the outgoing signal.

The basic concept is that in the sound reproduction system, either at the source side (FIG. 2B) or at the receiving side (FIG. 2A) or at both sides a voice articulation enhancer is provided, i.e. an means, e.g. a program or source code, which effects the signal in the manner as in accordance with the invention. Some examples are given herein below.

Noise contamination of a clean speech signal (signal 21) due to low-quality transmission (noise source 23) or to a noisy background (noise source 24) conditions can considerably affect its intelligibility. Many speech intelligibility improvement methods have the consequence that the loudness of the speech signal is increased. Algorithms that do not increase loudness are less common.

The invention is based on a simple method for enhancing the unvoiced phonemes based on their time domain energy level, e.g. by means of a speech enhancement algorithm. If the clean speech must be made robust to transmission noise (23), the algorithm (25, FIG. 2B) can best be placed at the emitter side. If ambient noise is the major noise disturbance (24), the algorithm (25, FIG. 2A) can best be placed at the reproduction side.

Figure 3:
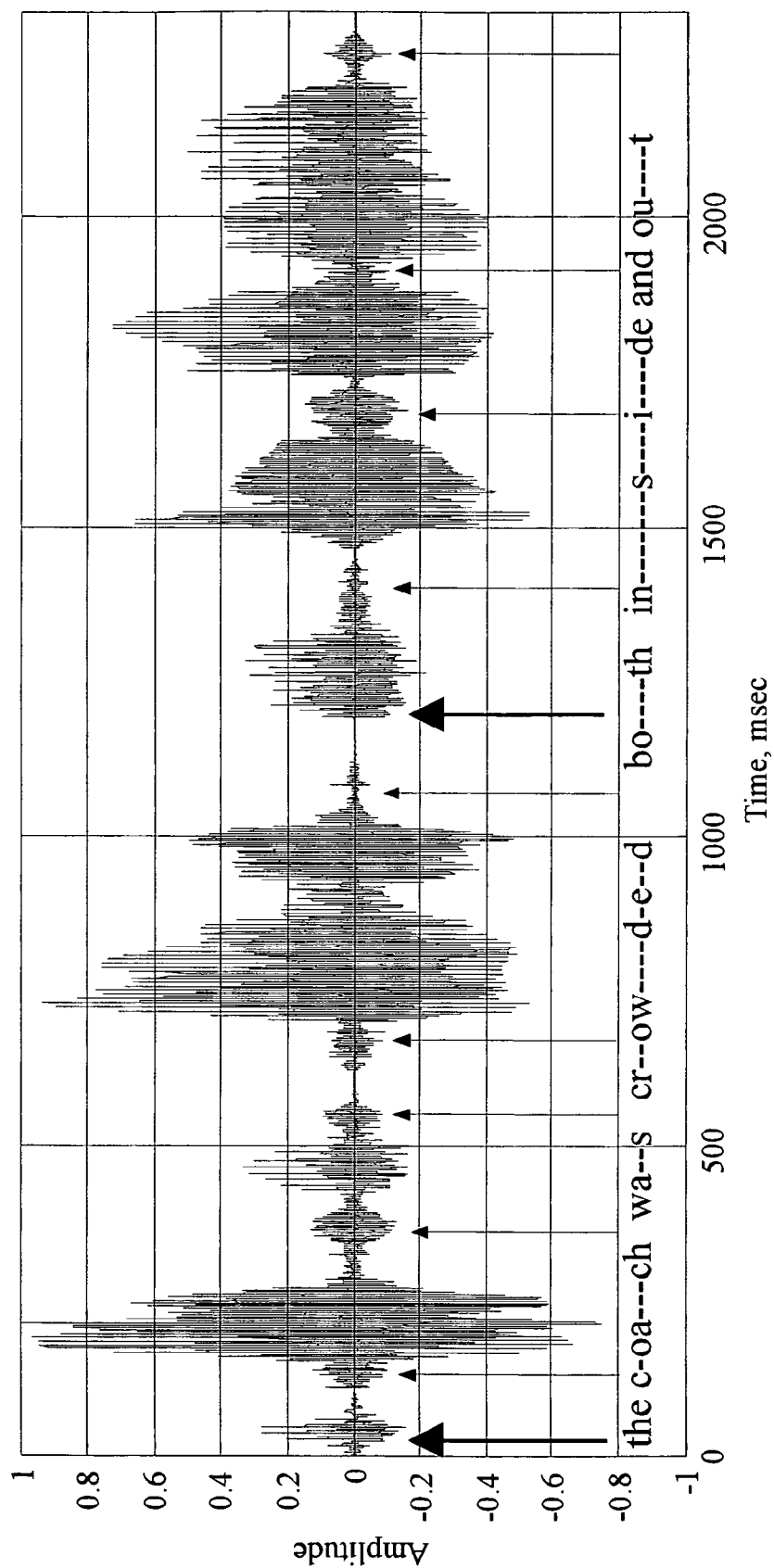
FIG. 3 shows the waveform of a clean male speech signal.

FIG. 3 shows the waveform of a clean male speech signal. The arrows show the positions of the unvoiced phonemes (th, c, ch, cr, d, b, th, s, de, t). These unvoiced segments contain few energy compared to the voiced segments (vowels such as oa, wa, ow, de, in, i, ou). The invention is based on the idea of selectively boosting the low energy range over the high energy range whereby the unvoiced phonemes are enhanced compared to the voiced ones. For intelligibility of speech the unvoiced phonemes are of major importance. The individual sounds used to create speech are called phonemes. Sources differ on exactly how many phonemes exist and what they are. Vowels are always voiced. For unvoiced consonants, the folds may be completely open (such as when producing "s", "sh", and "f" sounds) or partially open (for "h" sounds). Voiced sounds are created by vibrations of the vocal folds. Phonemes may be placed in one of three broad categories according to the mechanisms at work in their generation:

voiced sounds
fricative consonants
stop consonants

Voiced Sounds

The majority of phonemes used in English are voiced sounds caused by a periodic airflow though the vocal chords that is regulated by the glottis. The vocal tract resonates in response to this periodic airflow at formant frequencies. Formant frequencies distinguish one voiced phoneme from another and are controlled by tension in the vocal chords. Voiced sounds are further filtered by the actions of the nasal cavity and the mouth.

Examples: lame, vowel, you, met, . . .

Fricative Consonants

The unvoiced fricative phonemes stem from the hissing of a steady airstream through the mouth. Such sounds lack the combined glottal impulse and vocal tract vibration phenomenon of voiced sounds. Unvoiced phonemes are distinct from one another due to differences in the positions of the lips, teeth, and tongue rather than the presence of formant frequencies.

Examples: fat, sit, church, thing, . . .

The voiced fricative phonemes include both vocal tract formant resonances driven by glottal impulses and fricative hiss.

Examples: that, judge, which, . . .

Stop Consonants

The stop consonants are characterized by a complete cessation and sudden release of airflow by the lips and/or the teeth and tongue at the start of the phoneme.

The voiced stop consonants rely upon glottal impulses and vocal tract resonances.

Examples: bet, get, better, . . .

The unvoiced stop consonants are devoid of vocal tract activity and are dominated by fricative hiss.

Examples: kit, pet, ten, . . .

As explained above typically when a person speaks the voiced phonemes are typically in an amplitude range above a range typically comprising the unvoiced phonemes.

Figure 4:
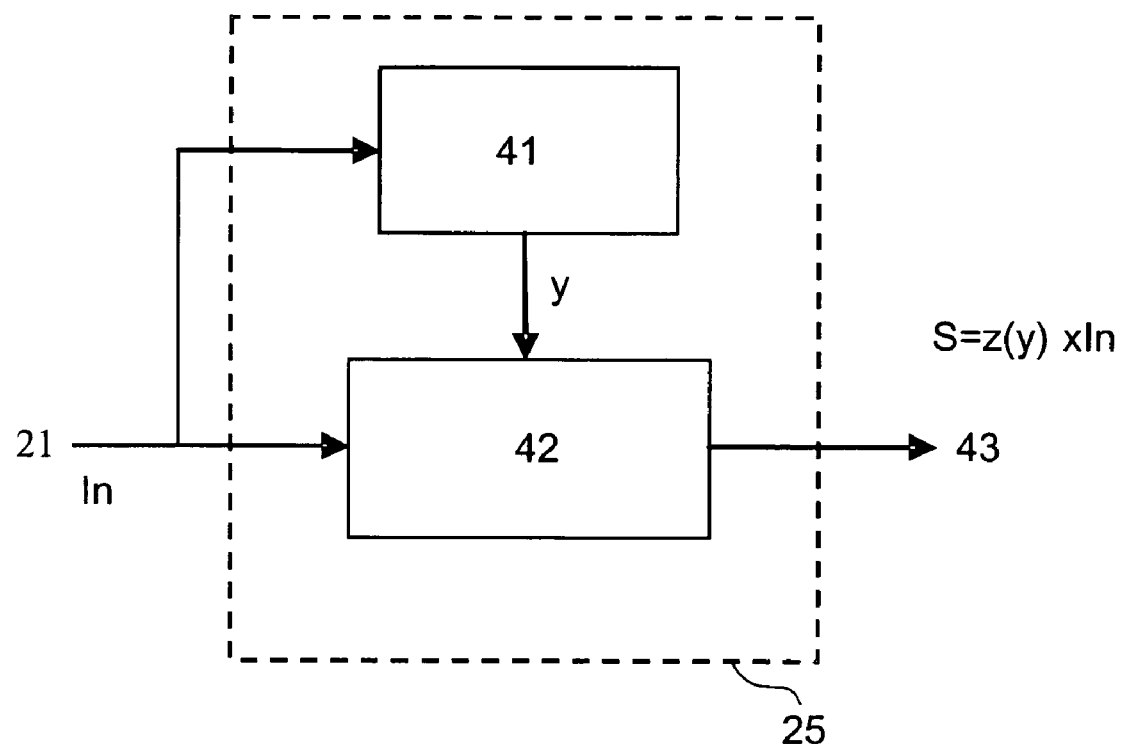
FIG. 4 illustrates an exemplary speech enhancement algorithm in accordance with the invention.

FIG. 4 illustrates very schematically a speech enhancement algorithm. Of the incoming signal 21 the input level is detected, e.g. the amplitude or power of the signal, in level detector 41, and dependent on the measured level the gain is adjusted in dynamic adjustor 42, giving an adjusted signal 43. In its simplest form the input level may be simply the input amplitude. However, in preferred embodiments a dynamic level detector, which determines an average level over a predetermined time period (typically a few to several milliseconds), is comprised in the system. The gain factor z is a function of the input level y, which, in such preferred embodiment is derived from averaging the input signal amplitude In. The incoming signal amplitude In is multiplied by the gain factor z to give the signal S ($S=z(y) \times In$).

Figure 5:
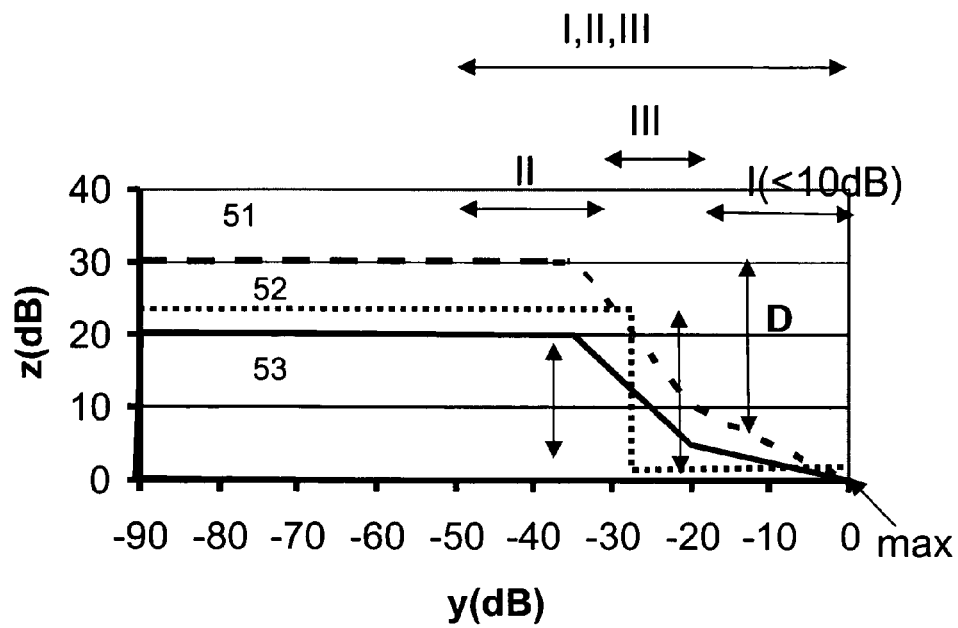
FIG. 5 illustrates the dynamic behavior, i.e. gain factor versus input level, of a speech enhancement algorithm in accordance with the invention.

FIG. 5 illustrates the dynamic behavior (i.e. the functional relation between z (gain factor) and y (amplitude or amplitude level)), of a number of speech enhancement algorithms in accordance with embodiments of the invention. The gain factor z (here shown on the vertical axis in dB) is a function of the input level y of the incoming signal (here shown on the horizontal axis in dB). The input level y is below a maximum, which in these embodiments is taken as the highest digital signal possible. The gain curve comprises a first range I, which has at an upper boundary the maximum input level MAX. In this first range the boost factor, i.e. the gain factor, is small typically below 3 dB. The first range I extends, in this example, at least 10 dB from the maximum MAX. Preferably the first range extends at least 15 dB, but not more than 30 dB. The gain curve comprises a second range II, which has a substantially higher gain factor z (at least 6 dB, preferably at least 12 dB, more preferably at least 18 dB, which difference is indicated in FIG. 5 by Δ). The range II extends typically between 15-35 dB or more below range I, so that the typical extent of ranges I and II combined (including intermediate range II) is 30-75 dB. In typical speech the dynamical range depends amongst others on how loud people speak, but the dynamical range for speech typically is 40 to 60 dB. FIG. 5 shows that a lower range of the dynamic range of speech (range II) is boosted with respect to the higher range I, which higher range has itself a low boost (below 10 dB). The ranges I and II cover, in this preferred example in the dynamic speech range (from 0 to approximately −50 dB), each range covering (along the y-axis) roughly the same range extent in dB (e.g. to within a factor of two expressed in number of dB). Too large a difference in extent along the y-axis between ranges I and II could lead to a situation wherein the intended boost of the unvoiced phonemes or soft sounds is too small if range II is considerably smaller than range I, or at least a considerably part of the voiced phonemes or hard sounds is also boosted if range II is considerably larger than I. The gain z to input level y curve may comprise a step, as in curve 52, but preferably, the gain curve comprises a third (III) range, intermediate to ranges I and II, in which the gain factor rises gradually, as is shown in curves 51 and 53. Such a transition range III decreases the risk of pumping artefacts. In this example the total extent of the ranges I, II and II covers the dynamic speech range (from 0 to approximately −50 dB) and each of the range I, II and III cover in the dynamic speech range roughly (e.g. to within a factor of 3 expressed in number of dB) the same range extent in dB. The difference in gain factor between range I and II is 25 dB, 22 dB and 15 dB, for curves 51, 52 and 53 respectively. The average gain factor can be computed by summing up the gain factors (z) multiplied with the strength of the input level and then dividing by the sum of the strength of the levels. The strongest signals (those with y-values close to zero) contribute most to this average gain factor, very weak signals (y-values of −30 or less) hardly contribute to the loudness, and a relatively large gain factor for very weak signals therefore hardly contributes to the average gain factor. Since close to zero (for the highest or higher input level, i.e. in range I) the gain factor is small (preferably considerably less than 10 dB), the average gain factor is small despite the fact that the gain factor in the second range II is large. The total average gain factor is preferably less than 12 dB, more preferably less than 6 dB, even more preferably less than 3 dB.

Figure 6:
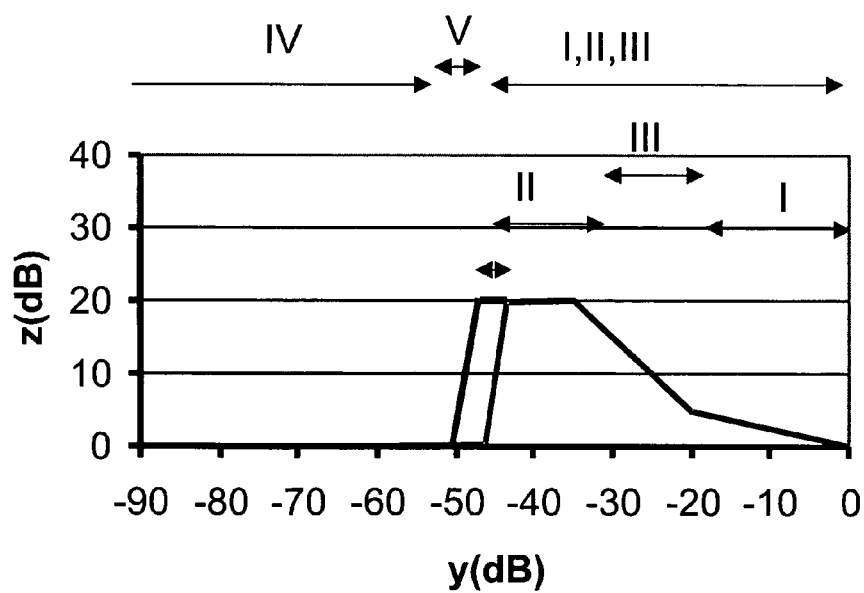
FIG. 6 illustrates the dynamic behavior, i.e. gain factor versus input level, of a speech enhancement algorithm in accordance with the invention, with transmission line noise reduction.

FIG. 6 shows a preferred embodiment of the invention. The gain curve comprises to the left (i.e. at input level below a lower threshold of range II) of the range II, a fourth range IV within which a much lower gain factor (preferably close to zero or negative dB) is applied. At such input levels the signal is probably mainly due to transmission noise. Usually the signal is produced by some device and then sent over transmission lines to some other position, even if there is no signal, the generating device and the transmission itself produced noise. In this preferred embodiment a much smaller gain factor (or preferably none at all) is applied below the lower boundary level of range II. Transmission or line noise is then not amplified. Preferably the second II and fourth IV range are separated by a fifth, intermediate, range V within which the gain factor gradually changes. A gradual change reduces the risk of artifacts, and may increase the signal-noise ratio. Where the transition points between range II and IV, or between II an IV and IV and V lie may be fixed, in simple embodiments of the invention, in which case the transition point between range IV and II or the range V, would preferably lie between 40 and 65 dB from the maximum input level. In preferred embodiments at least one, some or all of the transition points or transition ranges between ranges are made dependent on line or transmission noise measurements, in particular of transmission noise signals N1, as will be further explained below. The intermediate range III between the ranges I and II covers in this example 15 dB in input level. The range II covers 10 to 15 dB, the range V covers 5 dB, the range I covers 20 dB. The difference in gain factor between range I and II is 15 dB. The difference in gain between ranges II and IV is 20 dB and range V covers 5 dB, i.e. its slope is steeper than that of range III.

Figure 7:
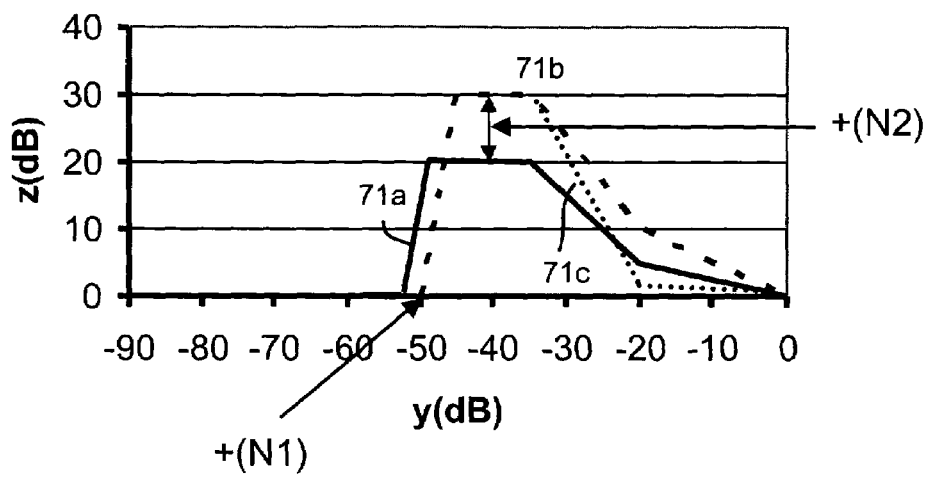
FIG. 7 illustrates the dynamic behavior, i.e. gain factor versus input level, of a speech enhancement algorithm in accordance with the invention; with variable transmission line reduction and variable background noise reduction.

FIG. 7 illustrates further embodiments of the invention. The gain curve comprises the five ranges identified in the previous figures. A number of curves are shown, 71a, 71b and 71c. Curve 71a is comparable to the curve shown in FIG. 6. When there is a high level of background noise (noise signal N2) it is advantageous to increase the gain factor in range II. This is schematically shown by curve 71b. In curve 71b the gain factor is increased in all of the ranges I, II and III, but more pronouncedly in range II. This will increase intelligibility, however, it will also increase the overall loudness. In preferred embodiments the increase in overall loudness is below 12 dB, preferably below 6 dB, more preferably below 3 dB. An increase in overall loudness does not increase the intelligibility. To keep the overall loudness in bounds, in preferred embodiments the increase in gain factor in range II as a response to background noise levels, is accompanied by no increase in range I, or even more preferably, by a small decrease in gain factor in range I, or at least in the upper part of range I. The overall loudness then does not, or not or hardly perceivably increase.

Figure 8:
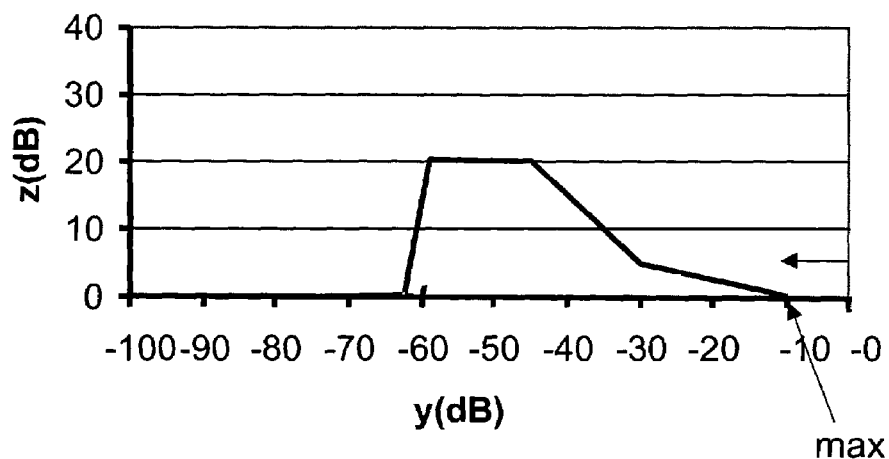
FIG. 8 illustrates the dynamic behavior, i.e. gain factor versus input level, of a speech enhancement algorithm in accordance with the invention, wherein the upper boundary of the first range is shifted.

FIG. 8 illustrates yet a further preferred embodiment of the invention. In the previous figures the upper boundary of range I was taken to be the highest possible signal strength. Often in digital signal processing this is taken to be a level of 0 dB. However, people may speak rather softly or loudly and the recording and transmission chains might introduce an unknown level of reduction to the speech signal. The difference in input level between the unvoiced and the voiced phonemes (or more in general between soft sounds and hard sounds) stays more or less the same (some 15-30 dB) whether one speaks loudly or softly. Thus, the inventors have realized that it is advantageous to shift the gain curve depending on the measured practical maximum input level of the signal, i.e.e.g. how loud the person in question actually speaks. If a person speaks very loud the position of the range I and II is shifted to high input level, if the person speaks softly the ranges I and II and with possible intermediate and adjacent ranges III, IV and V shift to lower input level. The outputs of the dynamic level indicator may be used establish the maximum level max by taking an average of the input amplitude over a predetermined time period longer than that used for measuring the dynamic input level. In the example schematically shown in FIG. 8 the actual maximum signal (e.g. the maximum loudness of the speech) strength stays 10 dB below the theoretical possible maximum (e.g. the maximum possible digital signal). Using the output of the dynamic level detector, averaged over a longer time period it is possible to establish the maximum input level, and use this to fix the position and form of the gain curve. In FIG. 8 the gain curve (z(y)) is shifted 10 dB to the left, schematically indicated by the arrow.

Figure 9:
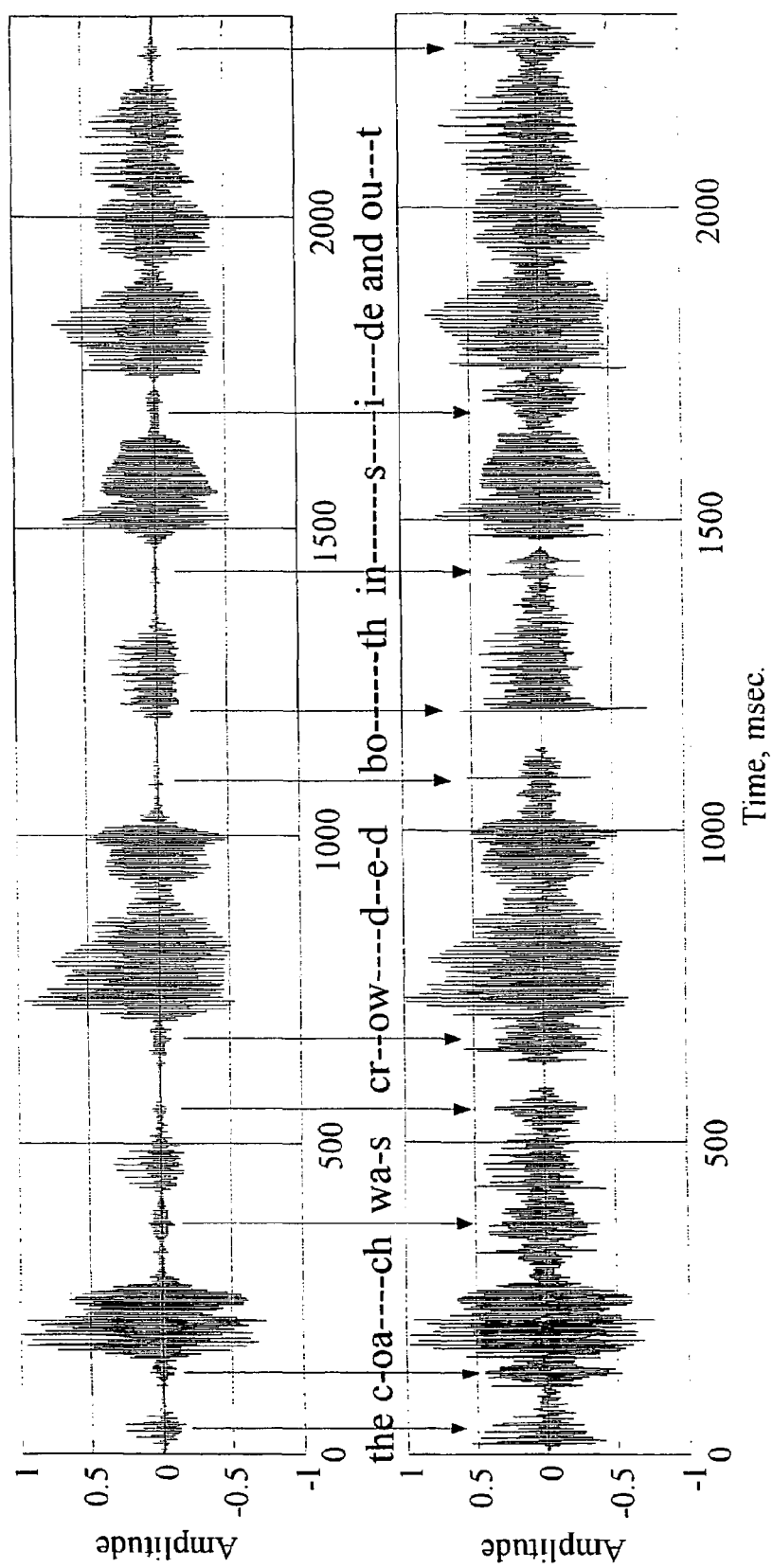
FIG. 9 illustrates the effect of the invention on a speech signal.

FIG. 9 shows the result of the dynamic processing curve (i.e. the relation between input amplitude and gain factor) as shown in FIG. 8 on the signal. The upper part is the same as FIG. 3, i.e. a clean male speech signal; the lower part illustrates the signal after having been dynamically processed using a speech enhancement algorithm in accordance with the invention. The unvoiced "soft" phonemes (indicated by arrows) are, in comparison to the voiced "hard" phonemes, more pronounced in the lower part of FIG. 9 than in the upper part. The low gain factor at low input intensities (below approximately −50 dB in the example of FIG. 8) has as an advantage that line or transmission noise is not or at least much less amplified. The following observations can be made:

- as indicated by the arrows, low amplitude regions, which correspond to unvoiced phonemes, are enhanced;
- voiced phonemes are not affected, meaning that loudness is preserved;
- non-spoken parts (silences) are not boosted.

In all the intelligibility of the speech is greatly improved by simple measures.

Figure 10:
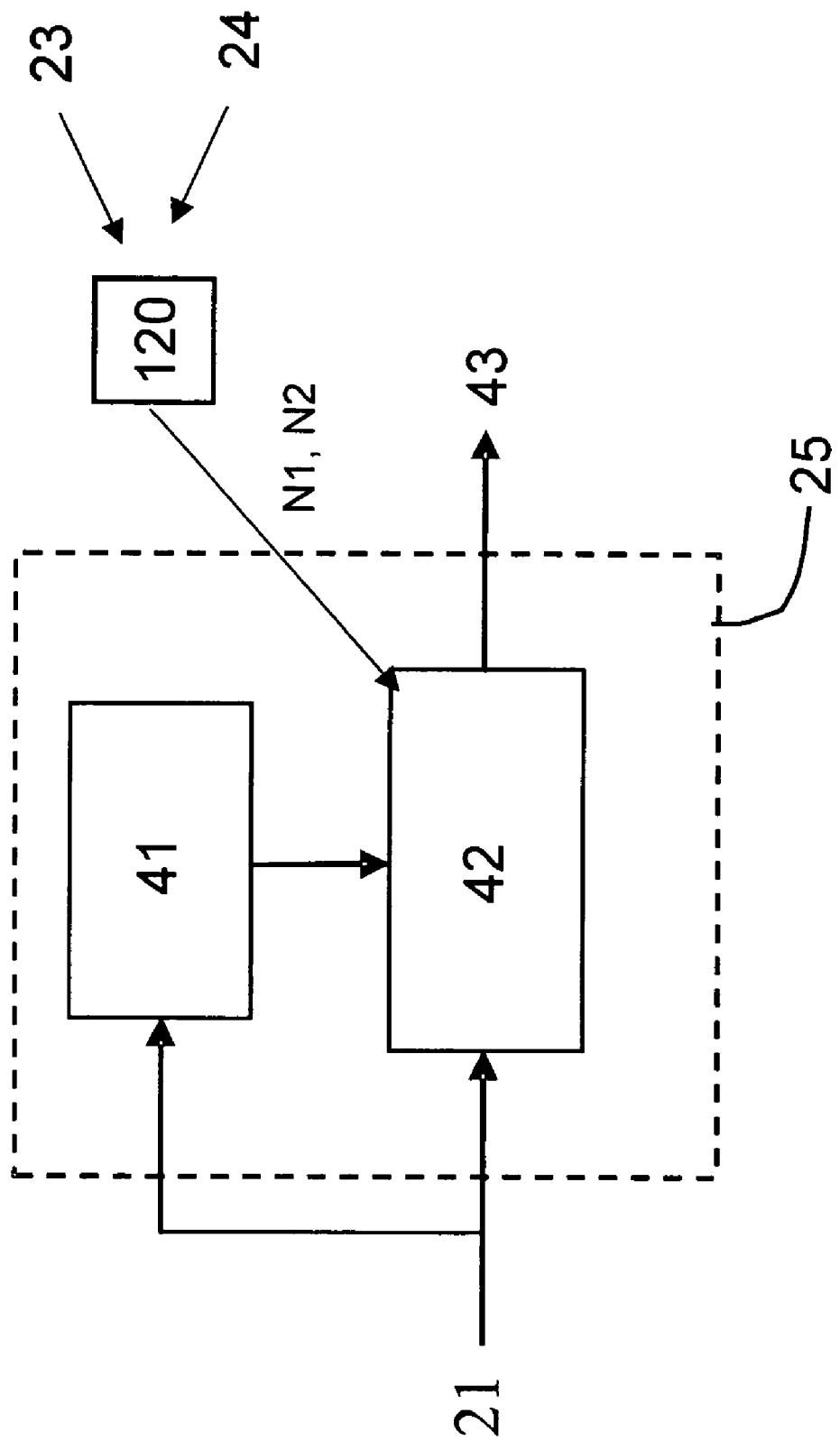
FIG. 10 illustrates in block diagram some elements of the invention.

The values of the maximum gain, the transition points between ranges, in short the characteristics of the dynamic processing curve in a device and method in accordance with the invention are in preferred embodiments and systems dependent on the background noise or line or transmission noise (23 or 24). To this end the background noise level is measured by a noise detector 120 a microphone, see also FIG. 2. The transmission noise may also be measured. Measuring the transmission noise may e.g. be accomplish by using a dynamic level detector and measuring the average signal during silences in between words or by some other average signal detector, and the characteristic values of the noise signal(s), or the noise signal N1, N2 itself are sent to the dynamic level adjustor 42. This dynamic level adjustor implements the multiplication of the gain factor with the signal. This is schematically shown in FIG. 10.

Figure 11:
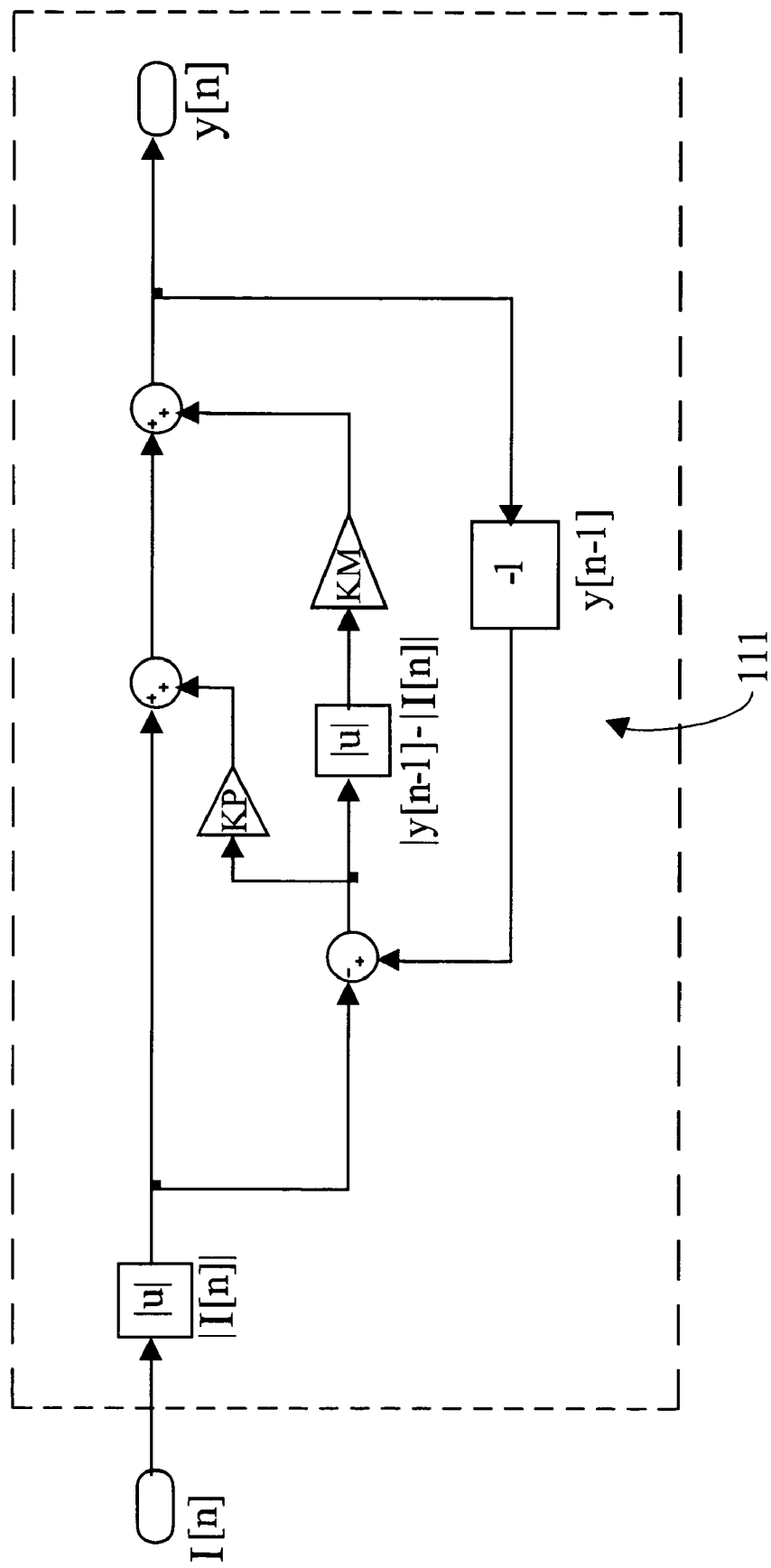
FIG. 11 illustrates in block diagram form a dynamic level detector.

Some exemplary embodiments of (parts of) speech enhancement algorithms are herein below described.

a. In order to provide a fast but smooth (sample-based) level detection, a Dynamic Level Detector is used of which a block-diagram is shown in FIG. 11. Its equations are $$y[n] = |I[n]| + KP \times (y[n-1] - |I[n]|) + KM \times |(y[n-1] - |I[n]|)|$$

where $$KP = (K_r + K_a)/2$$

$$KM = (K_r - K_a)/2$$

and $$K_a = e^{-1/(T_a f_s)}$$

$$K_r = e^{-1/(T_r f_s)}$$

$T_a$ and $T_r$ are respectively the attack and release time constants determining the time period over which an average is taken. Optimal results are obtained with $T_a$ and $T_r$ being several milliseconds (typically 1 to 5 ms). The dynamic level detector thus provides an input level y, which is a time average for the signal strength. An average over the levels, and thereby over the input amplitude taken over a longer time period then the attack and release time constants (e.g. 5 up to 20 times longer) may serve as an indicator of the maximum input level (which may be used to determine the value for max).

Establishing the input level amplitude dependent gain factor (or boost) z of the input signal I is in preferred embodiments done using a look-up table based dynamics processing. Let the y axis be the output of the dynamic level detector in decibels. For each I value, the Dynamics Processing block will boost the input speech signal by the corresponding gain in decibels on the z-axis as shown in e.g. FIG. 8 which shows an example of such curve in the case of a normalized full-bandwidth speech signal, like the one shown in FIG. 3. The gain factor preferably starts right above the noise level of the input speech signal. For a clean recorded speech signal, that level is typically below −50 dB. Boosting of noise is thereby avoided. The maximum gain factor (boost level) (20 dB in this case) is preferably made dependent of the ambient noise using e.g. and preferably a single microphone feedback.

The slope of the decrease in gain factor (the slope in range III) is preferably softer than the rise (in range V). This reduces the risk of pumping and echo artefacts.

Figure 12:
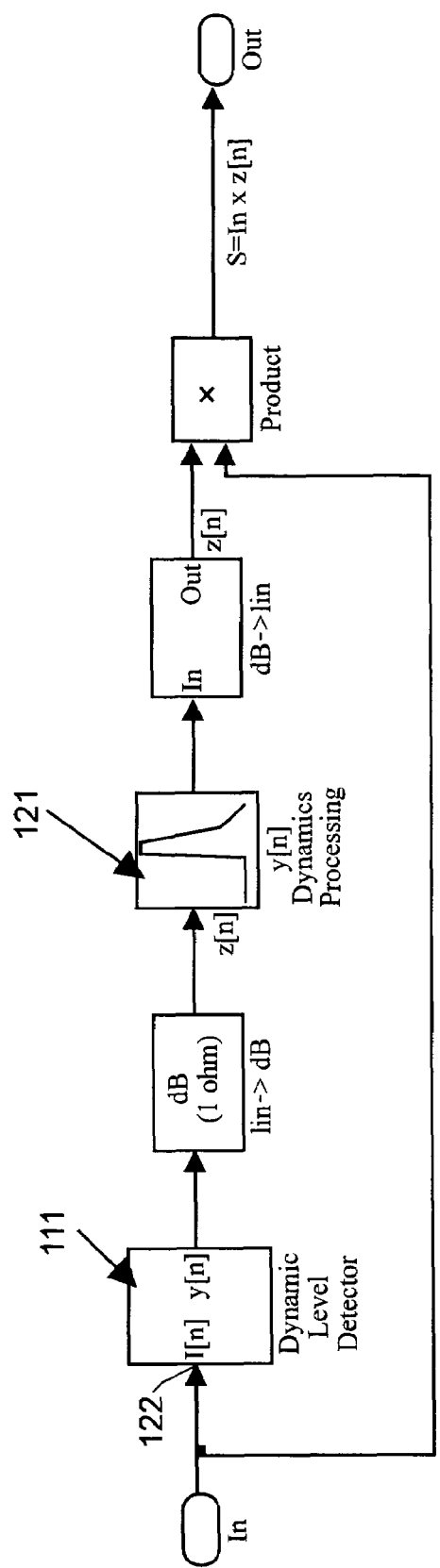
FIG. 12 shows an example of a Voice articulation enhancement algorithm.

FIG. 12 shows an example of a complete Voice Articulation Enhancement algorithm block-diagram.

A signal In comes in. From the stream of incoming signal In at input 122 of e.g. dynamic level detector 111 an input level y is calculated. An example of a dynamic level detector 111 is illustrated in FIG. 11. Using lookup table 121 comprising the dynamic curve, of which many examples are given in previous figures, the gain factor z(n) is calculated or determiner. This is multiplied with the incoming signal I(n) to provide the output signal S=I(n)xz(n). The conversion to dB is not a necessity, but makes the transfer curve more easy to implement, e.g. composed of straight lines.

In short the invention can be described as:

In a sound reproduction or recording system an audio signal is multiplied by a gain factor (z) which is dependent on the input level (y). The dependence of the gain factor on input level is chosen such that unvoiced phonemes are at least 6 dB, preferably at least 12 dB more enhanced than voiced phonemes, where preferably the average gain is less than 6 dB. This improves the intelligibility.

In practice whether or not unvoiced phonemes are more enhanced and how much more than voiced phonemes can be relatively easily checked in a system, e.g. by having a person whose mother tongue is English pronounce the sentence of FIG. 3 and then compare the outcoming signal with the incoming signal, and then compare the incoming and outgoing signal at each of the phonemes and compare the loudness of incoming and outgoing signal.

The algorithmic components disclosed may in practice be (entirely or in part) realized as hardware (e.g. areas on an application specific IC) or as software running on a special digital signal processor, a generic processor, etc.

It will be appreciated by persons skilled in the art that the present invention is not limited by what has been particularly shown and described hereinabove. The invention resides in each and every novel characteristic feature and each and every combination of characteristic features. Reference numerals in the claims do not limit their protective scope. Use of the verb "to comprise" and its conjugations does not exclude the presence of elements other than those stated in the claims. Use of the article "a" or "an" preceding an element does not exclude the presence of a plurality of such elements.

The invention claimed is:

1. A sound reproduction or recording system comprising an audio signal input, an audio signal processor and an audio signal output wherein the audio signal processor comprises an attributor for attributing a gain factor to input signals as a function of input level with a functional relationship such that the functional relationship between the gain factor and the input level comprises a first and second range, the first range covering amplitudes in which mainly voiced phonemes are situated, the second range situated at input levels lower than those for the first range and covering input levels in which mainly unvoiced phonemes are situated, wherein the functional relationship is such that the average gain factor for the first range lies at least 6 dB below that for the second range, wherein the attributor is arranged such that the average gain factor for the first and second ranges is less than 3 dB.

2. A sound reproduction or recording system as claimed in claim 1 wherein the attributor is arranged such that the gain factor in the first range is at least 12 dB lower than in the second range.

3. A sound reproduction or recording system as claimed in claim 1, wherein the system comprises a dynamic level detector having an input for the signal amplitude and an output for providing an average level over a predetermined time period.

4. A sound reproduction or recording system as claimed in claim 3, wherein the predetermined time period is 1 to 5 milliseconds.

5. A sound reproduction or recording system as claimed in claim 1, wherein the attributor is arranged such that the gain factor in the first range is on average below 6 dB.

6. A sound reproduction or recording system as claimed in claim 1, wherein the system comprises a determinator for determining a maximum input level of a received signal and a means for equating the maximum input level with the upper edge of the first range.

7. A sound reproduction or recording system as claimed in claim 1, wherein the attributor is arranged such that the functional relationship between the gain factor and the input level is such that between the first and second ranges a third, intermediate range is present in which the gain factor changes gradually.

8. A sound reproduction or recording system as claimed in claim 1, wherein the system comprises a sensor for measuring background noise, and an adjustor for adjusting the gain factor in the second range in dependency on the measured background noise.

9. A sound reproduction or recording system as claimed in claim 1, wherein the attributor is arranged such that the second range is, at a lower boundary value juxtaposed by a fourth range in which the gain factor is substantially zero.

10. A sound reproduction or recording system as claimed in claim 9, wherein the attributor is arranged such that the second and fourth ranges are separated by a fifth, intermediate range within which the gain factor gradually changes.

11. A sound reproduction or recording system as claimed in claim 9 wherein the attributor is arranged such that that the slope of the decrease in the gain factor in the third range is softer than the rise in gain factor in the fifth range.

12. A sound reproduction or recording system as claimed in claim 9, wherein the system comprises a measurer for measuring line or transmission noise or an input for a value for line or transmission noise and an adjustor for adjusting the transition point or transition range from the second range to the fourth range in dependence on amount of line or transmission noise.

13. A sound reproduction system as claimed in claim 1, wherein the sound reproduction system is a mobile telephone system.

14. A sound reproduction system as claimed in claim 1, wherein the signal processor is a digital signal processor.

15. A sound reproduction or recording system comprising a digital audio signal input, a digital audio signal processor and a digital audio signal output wherein the digital audio signal processor comprises an attributor for attributing a gain factor to input signals as a function of input level, wherein the functional relationship between the gain factor and the input level is such that a first and second range are present, the first range extending from a maximum value input level downwards at least 10 dB, the second range extending at input levels below the first range, said second range covering a range of 10 db or more, wherein the average gain factor in the first range is at least on average 6 dB lower than in the second range, wherein the attributor is arranged such that the average gain factor for the first and second ranges is less than 3 dB.

16. A sound reproduction system as claimed in claim 15, wherein the attributor is arranged such that the first range extends from the maximum value input level at least 15 dB, but not more 30 dB.

17. A method for audio signal enhancement in or for a sound reproduction or recording system in which an incoming audio signal is processed wherein input signals are multiplied with a gain factor, said gain factor being a function of input level, wherein the functional relationship between the gain factor and the input level is such that first and second ranges for the gain factor are present, the first range covering amplitudes in which mainly voiced phonemes are situated, the second range situated at input levels lower than those for the first range and covering input levels in which mainly unvoiced phonemes are situated, wherein the functional relationship is such that the average gain factor for the first range lies at least 6 dB below that for the second range, wherein the functional relationship between the gain factor and the input level is such that the average gain factor is less than 3 dB.

18. A method for audio signal enhancement as claimed in claim 17 wherein the functional relationship between the gain factor and the input level is such that the gain factor in the first range is at least 12 dB lower than in the second range.

19. A method for audio signal enhancement as claimed in claim 17, wherein the functional relationship between the gain factor and the input level is such that the first and second ranges are separated by a third, intermediate, range in which the gain factor changes gradually.

20. A method for audio signal enhancement as claimed in claim 17, wherein the functional relationship between the gain factor and the input level is such that the second range is, at a lower boundary value, juxtaposed by a fourth range in which the gain factor is substantially zero.

21. Method for audio signal enhancement as claimed in claim 20, wherein the functional relationship between the gain factor and the input level is such that the second and fourth ranges are separated by a fifth, intermediate, range within which the gain factor gradually changes.

22. Method for audio signal enhancement as claimed in claim 21, wherein the functional relationship between the gain factor and the input level is such that the slope of the decrease in the gain factor in the third range is softer than the rise in the gain factor in the fifth range.

23. Method for audio signal enhancement as claimed in claim 17, wherein the functional relationship between the gain factor and the input level is such that unvoiced phonemes are at least 6 dB more enhanced than voiced phonemes.

24. Computer program product comprising program code means stored on a computer readable medium for performing a method as claimed in claim 17 when said program is run on a computer.

25. A method for audio signal enhancement in or for a sound reproduction or recording system wherein input signals are multiplied with a gain factor, said gain factor being a function of input level, wherein the functional relationship between the gain factor and an input level is such that first and second ranges for the gain factor are present, the first range extending from a maximum value input level downwards at least 10 dB, the second range extending at input levels below the first range, said second range covering a range of 10 db or more, wherein the average gain factor in the first range is at least on average 6 dB lower than in the second range, wherein the functional relationship between the gain factor and the input level is such that the average gain factor is less than 3 dB.

26. Method for audio signal enhancement in a sound reproduction system in which an incoming audio signal is digitally processed wherein input signals are multiplied with a gain factor, said gain factor being a function of input level, wherein the functional relationship between the gain factor and the input level is such that unvoiced phonemes are at least 6 dB more enhanced than voiced phonemes, wherein the gain factor for both the unvoiced phonemes and voiced phonemes is greater than zero, the gain factor for the unvoiced phonemes being fixed at a particular level, the gain factor for the voiced phonemes being varied such that the gain factor is decreased inversely with respect to the input level of the voiced phonemes, wherein the functional relationship between the gain factor and the input level is such the overall loudness increase is less than 3 dB.

27. A sound reproduction or recording system comprising an audio signal input, an audio signal processor and an audio signal output wherein the audio signal processor comprises an attributor for attributing a gain factor to input signals as a function of input level with a functional relationship such that the functional relationship between the gain factor and the input level comprises a first and second range, the first range covering amplitudes in which mainly voiced phonemes are situated, the second range situated at input levels lower than those for the first range and covering input levels in which mainly unvoiced phonemes are situated, wherein the functional relationship is such that the average gain factor for the first range lies at least 6 dB below that for the second range, wherein the system comprises a determinator for determining a maximum input level of a received signal and a means for equating the maximum input level with the upper edge of the first range.

28. A sound reproduction or recording system comprising an audio signal input, an audio signal processor and an audio signal output wherein the audio signal processor comprises an attributor for attributing a gain factor to input signals as a function of input level with a functional relationship such that the functional relationship between the gain factor and the input level comprises a first and second range, the first range covering amplitudes in which mainly voiced phonemes are situated, the second range situated at input levels lower than those for the first range and covering input levels in which mainly unvoiced phonemes are situated, wherein the functional relationship is such that the average gain factor for the first range lies at least 6 dB below that for the second range, wherein the attributor is arranged such that the second range is, at a lower boundary value juxtaposed by a fourth range in which the gain factor is substantially zero.

* * * * *